(12) United States Patent
Kim

(10) Patent No.: US 9,269,670 B2
(45) Date of Patent: Feb. 23, 2016

(54) BONDING STRUCTURE OF SEMICONDUCTOR PACKAGE, METHOD FOR FABRICATING THE SAME, AND STACK-TYPE SEMICONDUCTOR PACKAGE

(71) Applicant: SK hynix Inc., Icheon-si, Gyeonggi-do (KR)

(72) Inventor: Seong Cheol Kim, Anseong-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/281,226

(22) Filed: May 19, 2014

(65) Prior Publication Data

US 2014/0252652 A1    Sep. 11, 2014

Related U.S. Application Data

(63) Continuation of application No. 13/305,985, filed on Nov. 29, 2011, now Pat. No. 8,766,457.

(30) Foreign Application Priority Data

Dec. 1, 2010 (KR) .................. 10-2010-0121245
Nov. 23, 2011 (KR) .................. 10-2011-0123017

(51) Int. Cl.
*H01L 23/48* (2006.01)
*H01L 23/538* (2006.01)
(Continued)

(52) U.S. Cl.
CPC ............ *H01L 23/5384* (2013.01); *H01L 24/03* (2013.01); *H01L 24/05* (2013.01); *H01L 24/11* (2013.01); *H01L 24/13* (2013.01); *H01L 24/14* (2013.01); *H01L 24/17* (2013.01); *H01L 25/0655* (2013.01); *H01L 25/0657* (2013.01); *H01L 23/481* (2013.01); *H01L 2224/0347* (2013.01); *H01L 2224/03452* (2013.01); *H01L 2224/03462* (2013.01); *H01L 2224/0401* (2013.01); *H01L 2224/0557* (2013.01); *H01L 2224/0568* (2013.01); *H01L 2224/05551* (2013.01); *H01L 2224/05578* (2013.01); *H01L 2224/05599* (2013.01); *H01L 2224/05609* (2013.01); *H01L 2224/05611* (2013.01); *H01L 2224/05616* (2013.01); *H01L 2224/05618* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/05664* (2013.01); *H01L 2224/05666* (2013.01);
(Continued)

(58) Field of Classification Search
CPC .................. H01L 23/5384; H01L 25/0655
USPC ............ 257/774, E23.011, E21.586; 438/612
See application file for complete search history.

(56) References Cited

U.S. PATENT DOCUMENTS

| | | | |
|---|---|---|---|
| 8,053,900 B2 * | 11/2011 | Yu et al. | 257/774 |
| 2009/0184414 A1 * | 7/2009 | Park et al. | 257/698 |
| 2010/0096760 A1 * | 4/2010 | Yu | H01L 24/05 |
| | | | 257/774 |

FOREIGN PATENT DOCUMENTS

| | | |
|---|---|---|
| CN | 101681900 A | 3/2010 |
| CN | 101728371 A | 6/2010 |

*Primary Examiner* — Elias M Ullah
(74) *Attorney, Agent, or Firm* — William Park & Associates Ltd.

(57) ABSTRACT

A bonding structure of a semiconductor package includes: a first conductive member configured to transmit an electrical signal; and a bonding pad configured to be electrically coupled to a surface of the first conductive member and comprising a plurality of sub bonding pads.

9 Claims, 9 Drawing Sheets

(51) Int. Cl.
*H01L 23/00* (2006.01)
*H01L 25/065* (2006.01)

(52) U.S. Cl.
CPC ............... *H01L2224/05669* (2013.01); *H01L 2224/05671* (2013.01); *H01L 2224/05684* (2013.01); *H01L 2224/0603* (2013.01); *H01L 2224/1132* (2013.01); *H01L 2224/1145* (2013.01); *H01L 2224/1147* (2013.01); *H01L 2224/11312* (2013.01); *H01L 2224/11452* (2013.01); *H01L 2224/11462* (2013.01); *H01L 2224/11849* (2013.01); *H01L 2224/133* (2013.01); *H01L 2224/134* (2013.01); *H01L 2224/13018* (2013.01); *H01L 2224/1318* (2013.01); *H01L 2224/13025* (2013.01); *H01L 2224/13027* (2013.01); *H01L 2224/13028* (2013.01); *H01L 2224/1329* (2013.01); *H01L 2224/1339* (2013.01); *H01L 2224/13078* (2013.01); *H01L 2224/13082* (2013.01); *H01L 2224/13099* (2013.01); *H01L 2224/13109* (2013.01); *H01L 2224/13111* (2013.01); *H01L 2224/13116* (2013.01); *H01L 2224/13118* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/13164* (2013.01); *H01L 2224/13166* (2013.01); *H01L 2224/13169* (2013.01); *H01L 2224/13171* (2013.01); *H01L 2224/13184* (2013.01); *H01L 2224/13339* (2013.01); *H01L 2224/13355* (2013.01); *H01L 2224/13393* (2013.01); *H01L 2224/1403* (2013.01); *H01L 2224/1411* (2013.01); *H01L 2224/16012* (2013.01); *H01L 2224/16145* (2013.01); *H01L 2224/16146* (2013.01); *H01L 2224/17106* (2013.01); *H01L 2224/17107* (2013.01); *H01L 2225/06541* (2013.01); *H01L 2924/00014* (2013.01); *H01L 2924/0103* (2013.01); *H01L 2924/014* (2013.01); *H01L 2924/0105* (2013.01); *H01L 2924/01006* (2013.01); *H01L 2924/01013* (2013.01); *H01L 2924/01023* (2013.01); *H01L 2924/01024* (2013.01); *H01L 2924/01029* (2013.01); *H01L 2924/01033* (2013.01); *H01L 2924/01042* (2013.01); *H01L 2924/01047* (2013.01); *H01L 2924/01049* (2013.01); *H01L 2924/01074* (2013.01); *H01L 2924/01078* (2013.01); *H01L 2924/01079* (2013.01); *H01L 2924/01082* (2013.01)

BONDING STRUCTURE OF SEMICONDUCTOR PACKAGE, METHOD FOR FABRICATING THE SAME, AND STACK-TYPE SEMICONDUCTOR PACKAGE

CROSS-REFERENCES TO RELATED APPLICATIONS

The present application claims priority under 35 U.S.C 119(a) to Korean Application Nos. 10-2010-0121245 and 10-2011-0123017 filed on Dec. 1, 2010 and Nov. 23, 2011, in the Korean intellectual property Office, which is incorporated herein by reference in its entirety set forth in full.

BACKGROUND

1. Field of the Invention

Embodiments of the present invention relate generally to a semiconductor package and a method for manufacturing the same, and more particularly, to a bonding structure of a semiconductor package including a stack-type semiconductor package.

2. Description of the Related Art

As demand for miniaturization and high performance of electronic products increases in line with the increased demand for mobile products, the demand for a semiconductor memory with small size and large capacity has increased. One method for increasing storage capacity of a semiconductor memory includes mounting and assembling a plurality of semiconductor chips in one semiconductor package. In this method, only a packaging process may be changed to increase the storage capacity of the semiconductor memory. Furthermore, increasing storage capacity has a lot of advantages in terms of capital requirement, research and development, and development time. Therefore, semiconductor memory manufacturers have made a variety of attempts to increase the storage capacity of a semiconductor memory device through a multi-chip package having a plurality of semiconductor chips mounted in one semiconductor package.

Methods of mounting a plurality of semiconductor chips in one semiconductor package may include mounting a plurality of semiconductor chips in a horizontal direction and mounting a plurality of semiconductor chips in a vertical direction. Because of the characteristics of electronic products, to pursue miniaturization most semiconductor memory manufacturers prefer a stack-type multi-chip package in which a plurality of chips are vertically stacked and packaged. As an example of the stack-type multi-chip package, a package structure using through silicon vias (TSVs) has been proposed. The package employing TSVs allows for a plurality of semiconductor chips that are physically and electrically coupled in a vertical direction through TSVs which are formed in the respective semiconductor chips at a wafer level.

In a conventional stack-type package using TSVs, semiconductor chips having TSVs and a chip pad are electrically coupled through a bonding metal such as solder. However, when the semiconductor chips are stacked using TSVs, the TSVs are coupled through one signal and one link. Therefore, even though only one signal is cut, an open failure may occur. Accordingly, even though only one signal among several thousands of signals is cut, it may lead to failure of the entire product.

SUMMARY

In one embodiment, a bonding structure of a semiconductor package includes: a first conductive member configured to transmit an electrical signal; and a bonding pad configured to be electrically coupled to a surface of the first conductive member and comprising a plurality of sub bonding pads.

The first conductive member may comprise a TSV. All or some of the sub bonding pads may have different heights from each other.

The bonding structure may further include a bonding member provided on upper surfaces of the sub bonding pads and electrically coupling the first conductive member to a second conductive member.

The bonding member may fill spaces over the upper surfaces of the sub bonding pads and spaces between the respective sub bonding pads.

The bonding member may include a plurality of sub bonding members each formed on an upper surface of a sub bonding pad.

A part of the sub bonding pads may be configured to be electrically coupled to a second conductive member, and another part of the sub bonding pads may be configured to be electrically coupled to a third conductive member.

In another embodiment, a method for manufacturing a bonding structure of a semiconductor package includes: forming a conductive member in a substrate, the conductive member configured to transmit an electrical signal; and forming a bonding pad configured to be electrically coupled to a surface of the conductive member and comprising a plurality of sub bonding pads spaced from each other.

The method may further include forming a bonding member on an upper surface of the bonding pad. The conductive member may comprise a TSV. The bonding member may comprise one of solder or an anisotropic conductive film.

The bonding member may include a plurality of sub bonding members each formed on an upper surface of a sub bonding pad, where the plurality of bonding members are spaced from each other.

The forming of the bonding pad may include: forming a photoresist pattern over the substrate, the photoresist pattern having a plurality of openings spaced from each other; forming a conductive material layer by burying a conductive material in the openings; forming a solder layer on an upper surface of the conductive material layer; and removing the photoresist pattern, and the sub bonding pads and sub bonding members may be simultaneously formed.

Forming the conductive material layer or the forming of the solder layer may be performed by electroless plating, electroplating, vacuum deposition, sputtering, chemical vapor deposition (CVD), screen printing, or dispensing.

The method may further include forming a seed layer over the substrate, before the forming of the photoresist pattern.

In another embodiment, a semiconductor package includes two or more stacked semiconductor chips, each semiconductor chip being configured to transmit an electrical signal and comprising a bonding pad comprising a plurality of sub bonding pads configured to be electrically coupled with an upper semiconductor chip among the semiconductor chips through at least two or more sub bonding pads of a lower semiconductor chip.

Each semiconductor chip of the two or more stacked semiconductor chips may comprise a conductive member comprising the sub bonding pads and further comprising a TSV. All or some of the sub bonding pads may have different heights.

The semiconductor package may further include a bonding member provided on upper surfaces of the sub bonding pads.

The bonding member may fill spaces over the upper surfaces of the sub bonding pads and spaces between the respective sub bonding pads.

The bonding member may include a plurality of sub bonding members each formed on an upper surface of a sub bonding pad.

A part of the sub bonding pads of the lower semiconductor chip may be configured to be electrically coupled to the upper semiconductor chip, and another part of the sub bonding pads of the lower semiconductor chips may be configured to be electrically coupled to another upper semiconductor chip.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, embodiments of the present invention will be described with reference to accompanying drawings. However, the embodiments are for illustrative purposes only and are not intended to limit the scope of the invention.

Figure 1:
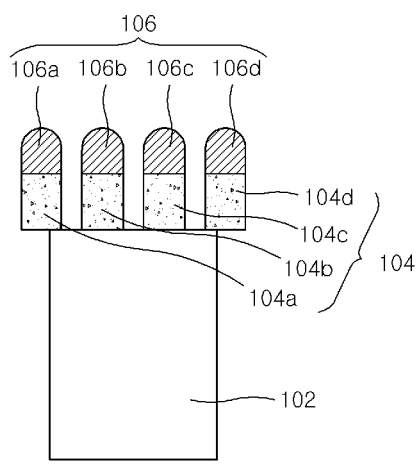
FIG. 1 is a cross-sectional view illustrating a partial construction of a bonding structure of a semiconductor package in accordance with an embodiment of the present invention.

FIG. 1 is a cross-sectional view illustrating a partial construction of a bonding structure of a semiconductor package in accordance with an embodiment of the present invention.

Referring to FIG. 1, the bonding structure of the semiconductor package in accordance with an embodiment of the present invention includes a first conductive member 102 and a bonding pad 104 having a plurality of sub bonding pads 104a to 104d. A bonding member 106 may exist on an upper surface of the bonding pad 104.

The first conductive member 102 may include a TSV, for example, but embodiments of the present invention are not limited thereto. Any conductive members may be used as long as the conductive members have a pad coupling. The first conductive member 102 may include one or more metals selected from the group consisting of gold (Au), silver (Ag), copper (Cu), aluminum (Al), nickel (Ni), tungsten (W), titanium (Ti), platinum (Pt), palladium (Pd), tin (Sn), plumbum (Pb), zinc (Zn), indium (In), cadmium (Cd), chrome (Cr), and molybdenum (Mo), and one or more nitrides of the metals, polysilicon, and a conductive organic material. The first conductive member 102 may have a single layer structure or multilayer structure. The polysilicon may be doped with impurities to improve conductance.

The bonding pad 104 includes the plurality of sub bonding pads 104a to 104d which may be electrically coupled to one surface (upper surface) of the first conductive member 102 and spaced from each other. Between the respective sub bonding pads 104a to 104d, an empty space exists. FIG. 1 illustrates four sub bonding pads 104a to 104d, but this is only an example. The bonding pad 104 may include two or more sub bonding pads. The sub bonding pads 104a to 104d may include one or more metals selected from the group consisting of Au, Ag, Cu, Al, Ni, W, Ti, Pt, Pd, Sn, Pb, Zn, In, Cd, Cr, and Mo, and one or more of the metals, polysilicon, and a conductive organic material. The sub bonding pads 104a to 104d may have a single layer structure or a multilayer structure. The polysilicon may include impurity-doped polysilicon.

The bonding member 106 may include a plurality of sub bonding members 106a to 106d that may be formed on respective upper surfaces of the sub bonding pads 104a to 104d. The sub bonding members 106a to 106d may be uncoupled, that is, the sub bonding members 106a to 106d may be spaced from each other. The sub bonding members 106a to 106d may be formed of a metal having a low fusing point, such as solder. The sub bonding members 106a to 106d may comprise an Sn—Pb-based alloy solder, an Sn—Pb—Ag-based alloy solder, or an SAC (Sn—Ag—Cu)-based alloy solder, but an embodiment of the present invention is not limited to the material of the sub bonding members 106a to 106d.

In the bonding structure in accordance with an embodiment of the present invention, one conductive member is coupled to a plurality of sub bonding pads so as to couple one signal through a plurality of contacts. Therefore, if the coupling of one or more sub bonding pads is opened, the signal coupling may be achieved through other sub bonding pads that remain coupled to the conductive member. Accordingly, a fail rate of the signal coupling may be significantly reduced, and bonding reliability may be increased.

Figure 2:
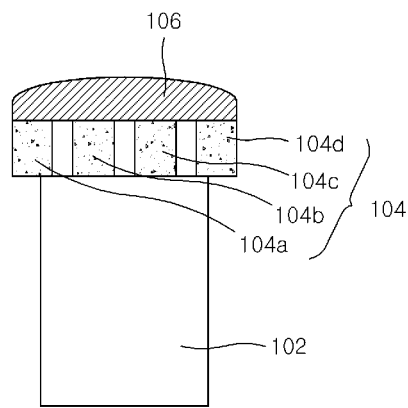
FIG. 2 is a cross-sectional view illustrating a partial construction of a bonding structure of a semiconductor package in accordance with an embodiment of the present invention.

FIG. 2 is a cross-sectional view illustrating a partial construction of a bonding structure of a semiconductor package in accordance with an embodiment of the present invention.

Referring to FIG. 2, the bonding structure of the semiconductor package in accordance with the embodiment of the present invention includes a first conductive member 102 and a bonding pad 104 having a plurality of sub bonding pads 104a to 104d, as in the above-described embodiment of the present invention. However, a bonding member 106 existing on upper surfaces of the sub bonding pads 104a to 104d may have a structure that is not separated, that is, the bonding member 106 may be formed as one bonding member. The bonding member 106 may be formed of a metal having a low fusing point, such as solder. The bonding member 106 may include Sn—Pb-based alloy solder, Sn—Pb—Ag-based alloy solder, or SAC (Sn—Ag—Cu)-based alloy solder, but embodiments of the present invention are not limited to the material of the bonding member 106.

Figure 3:
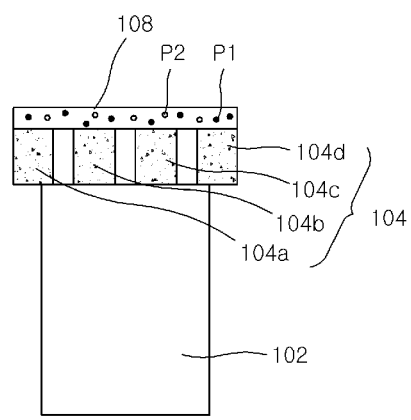
FIGS. 3 to 7 are cross-sectional views illustrating a partial construction of a bonding structure of a semiconductor package in accordance with an embodiment of the present invention.

FIG. 3 is a cross-sectional view illustrating a bonding structure of a semiconductor package in accordance with another embodiment of the present invention.

Referring to FIG. 3, the bonding structure of the semiconductor package in accordance with an embodiment of the present invention includes a first conductive member 102 and a bonding pad 104 having a plurality of sub bonding pads 104a to 104d. The bonding structure may further include a bonding member comprised of an anisotropic conductive film 108 formed on upper surfaces of the sub bonding pads 104a to 104d. Since the first conductive member 102 and the bonding pad 104 comprising the plurality of sub bonding pads 104a to 104d have been already described above, the further detailed descriptions thereof are omitted.

The anisotropic conductive film 108 may comprise conductive particles P1. When the temperature and pressure are raised, an electric contact is achieved by the conductive particles P1. The conductive particles P1 may include metal particles comprising nickel, solder, silver or the like, or carbon particles, or plastic particles such as polystyrene or epoxy resin coated with a metal layer, or conductive particles coated with insulation resin, or other conductive particles comprised of conductive material. The anisotropic conductive film 108 may comprise an adhesive material that may allow for adhering the bonding pad 104 to the anisotropic conductive film 108. The adhesive material may comprise one or more materials selected from the polyethylene or polypropylene-based thermoplastic resin, epoxy, polyurethane, or acryl-based thermosetting resin, and UV curable resin may be used, but the types of adhesive materials that may be used is not limited thereto. Furthermore, the anisotropic conductive film 108 may contain insulation particles P2.

Figure 4:
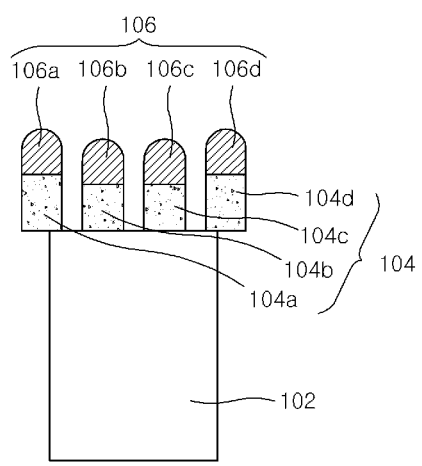
Figure 5:
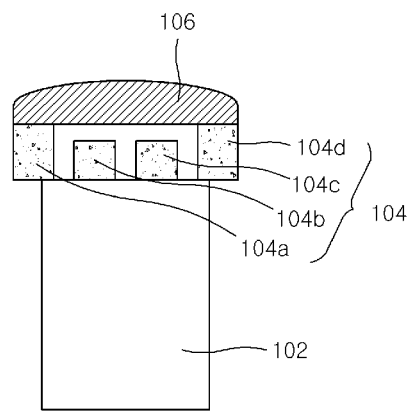

FIGS. 4 and 5 are cross-sectional views illustrating a partial construction of a bonding structure of a semiconductor package in accordance with an embodiment of the present invention.

Referring to FIGS. 4 and 5, the bonding structure of the semiconductor package in accordance with an embodiment of the present invention includes a first conductive member 102 and a bonding pad 104 having a plurality of sub bonding pads 104a to 104d. The bonding structure may further include a bonding member 106 formed on upper surfaces of the bonding pad 104 and having a plurality of sub bonding members 106a to 106d. Since the first conductive member 102 has been described above, further detailed descriptions thereof are omitted.

The bonding pad 104 includes the plurality of sub bonding pads 104a to 104d as illustrated in various embodiments of FIGS. 1 to 3, but in an embodiment depicted in FIG. 4 all or some of the sub bonding pads 104a to 104d may have different heights. For example, the first and fourth sub bonding pads 104a and 104d may be taller than the second and third sub bonding pads 104b and 104c, the first and fourth sub bonding pads 104a and 104d may have a substantially similar height, and the second and third sub bonding pads 104b and 104c may have a substantially similar height. An embodiment depicted in FIG. 5 comprises a bonding member 106 that may be substantially in contact with sub bonding pads 104a and 104d.

Figure 6:
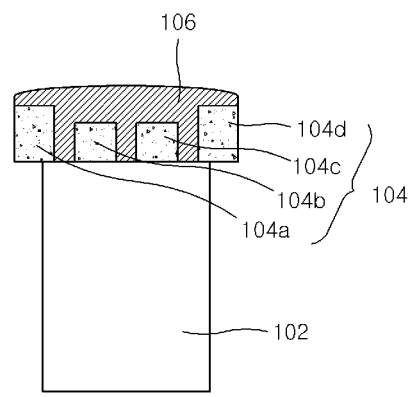

FIG. 6 is a cross-sectional view illustrating a partial construction of a bonding structure of a semiconductor package in accordance with another embodiment of the present invention.

Referring to FIG. 6, the bonding structure of the semiconductor package in accordance with an embodiment of the present invention includes a first conductive member 102 and a bonding pad 104 having a plurality of sub bonding pads 104a to 104d. Furthermore, a bonding member 106 may be formed on the upper surface of the bonding pad 104. The bonding member 106 may serve as an electrical and physical coupling to a second conductive member (not depicted). The bonding member 106 may be formed in such a manner as to fill spaces over the upper surfaces of the sub bonding pads 104a to 104d, and spaces between the sub bonding pads 104a and 104d. If the bonding member 106 is formed of solder, the spaces may be filled by a reflow process.

Figure 7:
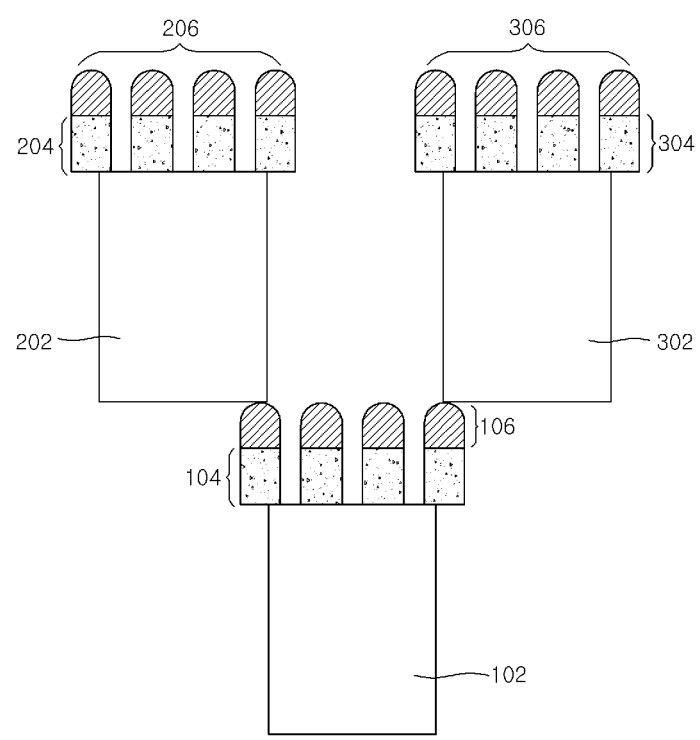

FIG. 7 is a cross-sectional view illustrating a partial construction of a bonding structure of a semiconductor package in accordance with another embodiment of the present invention.

Referring to FIG. 7, a first bonding pad 104 having a plurality of sub bonding pads is formed over a first conductive member 102. A part or some of the sub bonding pads comprising the first bonding pad 104 may be electrically coupled to a second conductive member 202 through a first bonding member 106. Another portion of the sub bonding pads comprising the first bonding pad 104 may be electrically coupled to a third conductive member 302 through the first bonding member 106. The first conductive member 102, the second conductive member 202, and the third conductive member 302 may include TSVs. The first conductive member 102 may be formed in a first chip, and the second and third conductive members 202 and 302 may be formed in a second chip stacked over the first chip. In this way it may be said that a lower semiconductor chip may be electrically coupled with an upper semiconductor chip. Or, vice-versa, an upper semiconductor chip may be electrically coupled with a lower semiconductor chip. In an embodiment of the present invention, one signal of a conductive member (such as 102 in FIG. 7) is transferred to two or more conductive members (such as the second and third conductive members 202, 302 in FIG. 7 that are coupled to the first conductive member 102). However, the number of conductive members receiving a signal is not limited to two according to an embodiment of the present invention. For example, the conductive member 102 in FIG. 7 may be configured to be connected with any plural number of conductive members to transfer the signal.

Figure 8:
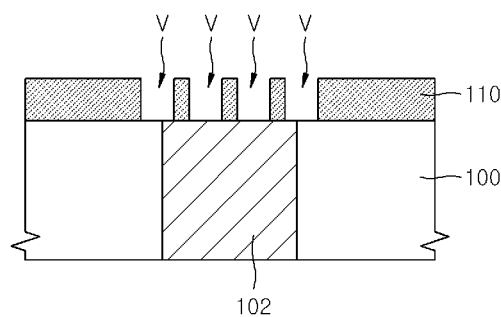
FIGS. 8 to 10 are cross-sectional views illustrating a method for manufacturing a bonding structure of a semiconductor package in accordance with an embodiment of the present invention.
Figure 9:
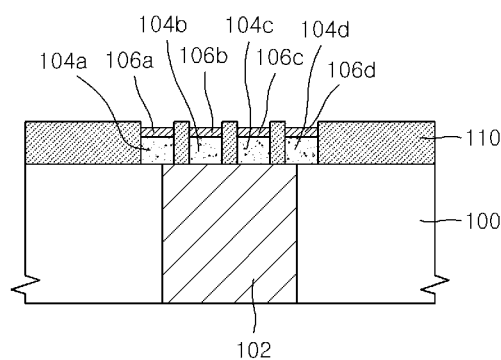
Figure 10:
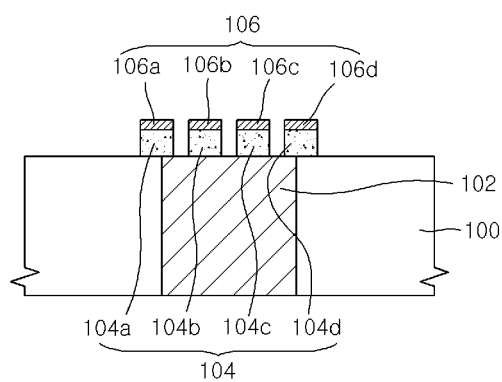

FIGS. 8 to 10 are cross-sectional views illustrating a method for manufacturing a bonding structure of a semiconductor package in accordance with an embodiment of the present invention.

Referring to FIG. 8, a conductive member 102 is formed in a semiconductor substrate 100, and photoresist is applied onto the upper surface of the substrate 100 and patterned through exposure and development to form a photoresist pattern 110 having a plurality of openings V with a predetermined shape. The conductive member 102 may include a structure with a predetermined shape, such as a TSV, which is electrically conducted. Before the photoresist is applied, a stress buffer layer for relieving a stress may be further formed on an upper surface of the substrate 100. If the openings V are filled by electroplating, then a process of forming a seed layer through sputtering, vacuum deposition, or electroless plating may be further performed.

Referring to FIG. 9, a plurality of conductive material layers and solder layers are sequentially formed to fill the openings V. The conductive material layers filling the openings V form a plurality of sub bonding pads 104a to 104d, and the solder layers form a plurality of sub bonding members 106a to 106d. The conductive material layers for forming the sub bonding pads 104a to 104d and the solder layers for forming the sub bonding members 106a to 106d, which fill the openings V, may be formed by electroless plating, electroplating, vacuum deposition, sputtering, chemical vapor deposition (CVD), screen printing, or dispensing.

For example, the openings may be filled by Cu electroplating. In this case, a seed metal layer may be formed before performing the Cu electroplating process. An electroplating solution, which is used during the Cu electroplating, may include, inter alia, a Cu ion source, sulphuric acid ($H_2SO_4$) for controlling conductance, and hydrochloric acid (HCl) for controlling a reduction. The electroplating solution may further include additional agents. For example, when $CuSO_4$ serving as a Cu ion source is put into $H_2SO_4$ and water, $CuSO_4$ is decomposed into $Cu^{2+}$ ions and $SO_4^{2-}$ ions. After the Cu electroplating, gold electroplating may be further performed to improve the electrical characteristics. However, electroplating gold directly on Cu with no intermediate layer therebetween could cause some limitations to improving the overall conductivity. This is because when gold is electroplated directly on Cu, the gold and Cu elements tend to move toward each other, which acts against improving the conductance through gold plating. Therefore, nickel plating may be performed before the gold electroplating.

A plating solution for the gold electroplating may include chloroaurate or gold sulfite as a gold source and a cyanide-based or non-cyanide-based compound as a chelating agent. According to an embodiment of the present invention, it is possible to use the plating solutions other than chloroaurate or gold sulfite for the gold electroplating. The process of forming a nickel layer through nickel electroplating is not limited. For example, a solution including $NiSO_4.6H_2O$ (120~230 g/L), $NiCL_2$ (5~35 g/L), and $H_3PO_4$ (5~35 g/L) may be used; or a solution including $NiSO_4.6H_2O$ (120~230 g/L), $Na_4Cl$ (10~30 g/L), and $ZnSO_4.7H_2O$ (20~50 g/L) may be used. The nickel layer may be formed under a condition of a solution temperature of 25 to 50° C. and pH 4~7, but it is not limited thereto according an embodiment of the present invention.

According to an embodiment of the present invention, metal paste may be buried in the openings V by screen printing and then dried and baked to form conductive material layers having a conductive material buried therein. Or, a conductive material may also be buried in the openings by an electroless plating or CVD process. Specifically, tungsten (W), titanium (Ti), tungsten nitride, or titanium nitride may be buried by a CVD process.

Referring to FIG. 10, the photoresist pattern 110 is removed to form a bonding pad 104 having the plurality of sub bonding pads 104a to 104d and a bonding member 106 having the plurality of sub bonding members 106a to 106d. The sub bonding members 106a to 106d may be formed of solder and may be reflowed through a reflow process, thereby forming the structure as illustrated in FIG. 1.

The above description relating to manufacturing a bonding structure of a semiconductor package is described in accordance with an embodiment of the present invention, but it should be readily understood that other variations are possible. For example, the bonding pad 104 and the bonding member 106 may be formed separately. In this case, the bonding member 106 may not be a bonding member having a plurality of sub bonding members spaced from each other, but may be one bonding member which is not separated. Furthermore, the bonding pad 104 may be formed by a semiconductor thin film or thick film formation technology, and an anisotropic conductive film may be used as the bonding member 106.

FIGS. 11 to 14 are cross-sectional views illustrating a stack-type semiconductor package in accordance with an embodiment of the present invention.

Figure 11:
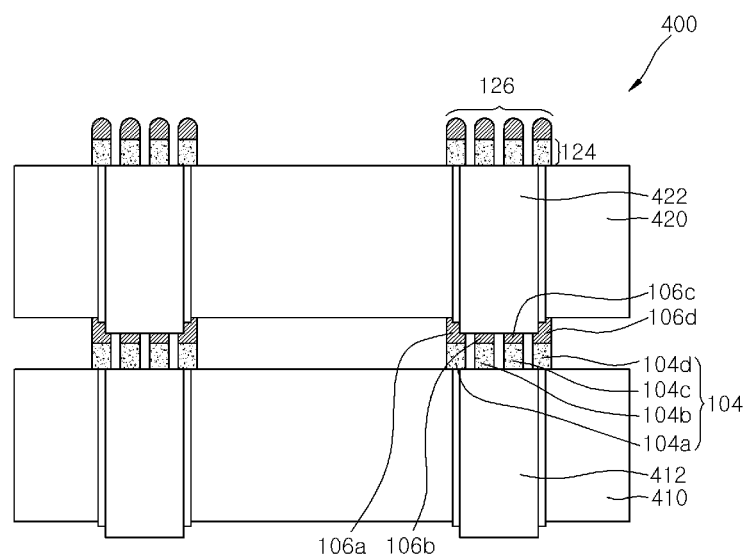
FIGS. 11 to 14 are cross-sectional views illustrating a stack-type semiconductor package in accordance with an embodiment of the present invention.

Referring to FIG. 11, the stack-type semiconductor package 400 in accordance with an embodiment of the present invention includes a first chip 410 and a second chip 420 which are stacked and electrically coupled to each other through a bonding member comprising sub bonding members 106a to 106d. The first chip 410 includes a first conductive member 412 and a first bonding pad 104. The second chip 420 includes a second conductive member 422 and a second bonding pad 124. A third chip (not illustrated), which may be additionally stacked over the second chip 420, may be coupled through a second bonding member 126.

Each of the first conductive member 412 and the second conductive member 422 may be formed with a TSV when needed. Any conductive structures having a pad coupling may be used as the first and second conductive members 412 and 422.

The first bonding pad 104 is electrically coupled to a surface (e.g., an upper surface) of the first conductive member 412, and may include a plurality of sub bonding pads 104a to 104d spaced from each other. FIG. 11 illustrates a case in which the first bonding pad 104 includes four sub bonding pads 104a to 104d. However, this is only an example, and the first bonding pad 104 may include two or more sub bonding pads. The second bonding pad 124 may include a plurality of sub bonding pads, like the first bonding pad 104.

Since the conductive members 412 and 422, the bonding pads 104 and 124, and the bonding members 106 and 126 have been already described above in detail, further detailed descriptions thereof are omitted.

FIG. 11 illustrates a stack-type package employing the bonding structure illustrated in FIG. 1. Embodiments of the bonding structures illustrated in FIGS. 2 to 7 may also be used to implement a stack-type package in accordance with an embodiment of the present invention.

Figure 12:
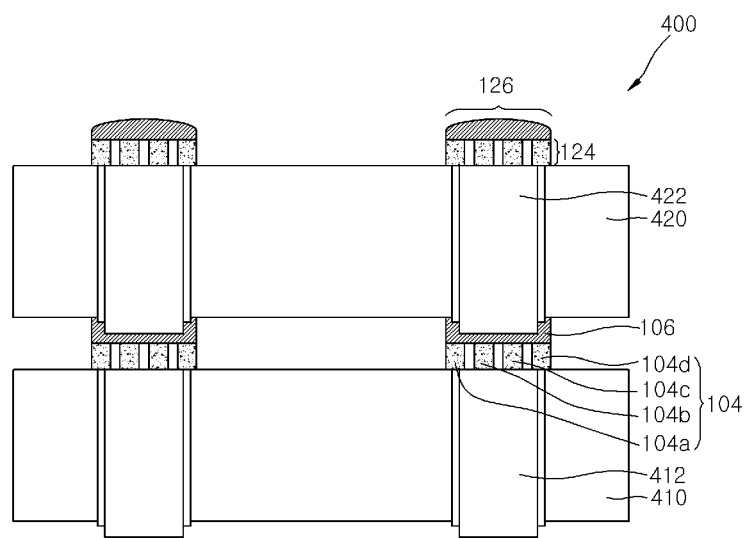

FIG. 12 is a cross-sectional view of a stack-type package employing the bonding structure illustrated in FIG. 2. Just as in FIG. 2, the bonding members 106 and 126 of FIG. 12 may be formed as a single piece, that is, the bonding members 106 and 126 may each be formed as one bonding member which is not separated.

Figure 13:
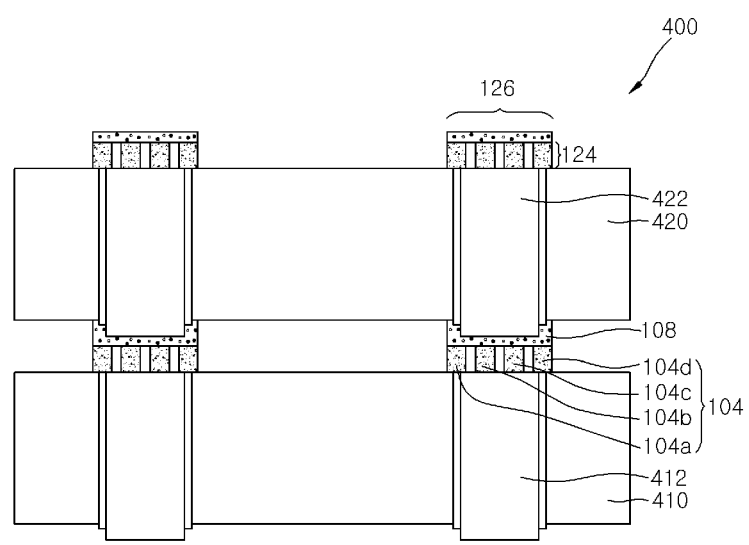

FIG. 13 is a cross-sectional view of a stack-type package employing the bonding structure illustrated in FIG. 3. Just as in FIG. 3, the bonding members of FIG. 13 may comprise an anisotropic conductive film 108.

Figure 14:
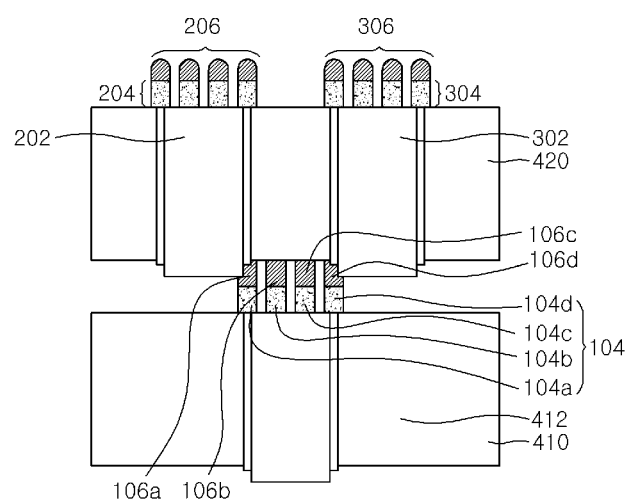

FIG. 14 is a cross-sectional view of a stack-type package employing the bonding structure illustrated in FIG. 7. FIG. 14 illustrates a case in which a part of the sub bonding pads is electrically coupled to a second conductive member 202 through the first sub bonding member 106a, and another part of the sub bonding pads is electrically coupled to a third conductive member 302 through the fourth sub bonding member 106d.

In FIGS. 12 to 14, the structures of the stack-type packages excluding the bonding pad and the bonding member of FIG. 11 are identical to each other, and thus further detailed descriptions thereof are omitted. Furthermore, although not illustrated, stack-type packages employing the bonding structures illustrated in FIGS. 4 to 6 may be applied.

Embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. A bonding structure of a semiconductor package, comprising:
   a substrate, having a front side and a back side;
   a TSV through the substrate, the TSV being configured with conductive layer, wherein a surface of the TSV is exposed at the front side of the substrate; and
   a plurality of sub bonding pads configured to be electrically coupled to the exposed surface of the TSV in common, and
   wherein the surfaces of the sub bonding pads are directly contacted to the exposed surface of the TSV.

2. The bonding structure of claim 1, further comprising a plurality of bonding members, each of the bonding members provided on upper surface of each of the sub bonding pads.

3. The bonding structure of claim 1, further comprising a bonding member provided on upper surfaces of the sub bonding pads.

4. The bonding structure of claim 3, wherein the bonding member fills spaces over the upper surfaces of the sub bonding pads and spaces between the respective sub bonding pads.

5. A semiconductor package comprising two or more stacked semiconductor chips, each semiconductor chip comprising:
a substrate, having a front side and a back side;
a first TSV through the substrate, the first TSV being configured with conductive layer, wherein a surface of the TSV is exposed at the front side of the substrate; and
a plurality of sub bonding pads configured to be electrically coupled to the exposed surface of the TSV in common, and
wherein the surfaces of the sub bonding pads are directly contacted to the exposed surface of the TSV.

6. The semiconductor package of claim 5, further comprising a plurality of bonding members, each of the bonding members provided on upper surface of each of the sub bonding pads and configured to electrically couple the stacked semiconductor chips.

7. The semiconductor package of claim 5, further comprising a plurality of bonding members, each of the bonding members provided between upper surface of each of the sub bonding pads in the lower semiconductor chip and bottom surface of the TSV in the upper semiconductor chip.

8. The semiconductor package of claim 5, further comprising a bonding member provided between upper surfaces of the sub bonding pads in the lower semiconductor chip and bottom surface of the TSV in the upper semiconductor chip.

9. The semiconductor package of claim 8, wherein the bonding member fills spaces over the upper surfaces of the sub bonding pads in the lower semiconductor chip and spaces between the respective sub bonding pads.

* * * * *